United States Patent
Lee et al.

(10) Patent No.: US 12,255,237 B2
(45) Date of Patent: Mar. 18, 2025

(54) SEMICONDUCTOR MEMORY DEVICE AND METHOD OF MANUFACTURING THE SAME

(71) Applicant: SK hynix Inc., Icheon-si (KR)

(72) Inventors: Chang Soo Lee, Icheon-si (KR); Young Ho Yang, Icheon-si (KR); Sung Soon Kim, Icheon-si (KR); Hee Soo Kim, Icheon-si (KR); Hee Do Na, Icheon-si (KR); Min Sik Jang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/468,259

(22) Filed: Sep. 15, 2023

(65) Prior Publication Data
US 2024/0006495 A1    Jan. 4, 2024

Related U.S. Application Data

(62) Division of application No. 17/231,629, filed on Apr. 15, 2021, now Pat. No. 11,799,003.

(30) Foreign Application Priority Data

Dec. 3, 2020   (KR) ........................ 10-2020-0167805

(51) Int. Cl.
| | |
|---|---|
| H01L 29/417 | (2006.01) |
| H01L 29/08 | (2006.01) |
| H01L 29/40 | (2006.01) |
| H01L 29/66 | (2006.01) |
| H01L 29/786 | (2006.01) |

(52) U.S. Cl.
CPC .... H01L 29/41741 (2013.01); H01L 29/0847 (2013.01); H01L 29/401 (2013.01); H01L 29/66666 (2013.01); H01L 29/78642 (2013.01)

(58) Field of Classification Search
CPC ........... H01L 29/41741; H01L 29/0847; H01L 29/401; H01L 29/66666; H01L 29/78642; H01L 29/66825; H01L 29/66833; H01L 29/788; H01L 29/792; H10B 41/27; H10B 43/27; H10B 41/35; H10B 43/35
See application file for complete search history.

(56) References Cited

U.S. PATENT DOCUMENTS

| | | |
|---|---|---|
| 2015/0255481 A1 | 9/2015 | Baenninger et al. |
| 2017/0033121 A1 | 2/2017 | Miyamoto et al. |

(Continued)

FOREIGN PATENT DOCUMENTS

| | | |
|---|---|---|
| KR | 100908823 B1 | 7/2009 |
| KR | 1020200120112 A | 10/2020 |
| TW | 202025463 A | 7/2020 |

*Primary Examiner* — Khaja Ahmad
*Assistant Examiner* — Khatib A Rahman
(74) *Attorney, Agent, or Firm* — WILLIAM PARK & ASSOCIATES LTD.

(57) ABSTRACT

A semiconductor memory device, and a method of manufacturing the semiconductor memory device, includes a first source layer, a second source layer on the first source layer, a stack on the second source layer, a channel structure passing through the stack and the second source layer, and a common source line passing through the stack and the second source layer. The second source layer includes an air gap and a conductive layer surrounding the air gap.

9 Claims, 14 Drawing Sheets

(56) References Cited

U.S. PATENT DOCUMENTS

| | | |
|---|---|---|
| 2019/0244970 A1 | 8/2019 | Jung et al. |
| 2019/0333931 A1 | 10/2019 | Jung et al. |
| 2020/0357815 A1 | 11/2020 | Iwai et al. |
| 2020/0403001 A1* | 12/2020 | Arai .................... H01L 29/0847 |
| 2021/0065809 A1* | 3/2021 | Hwang .................. G11C 5/063 |
| 2021/0265271 A1* | 8/2021 | Chung .................... H01L 25/18 |

* cited by examiner

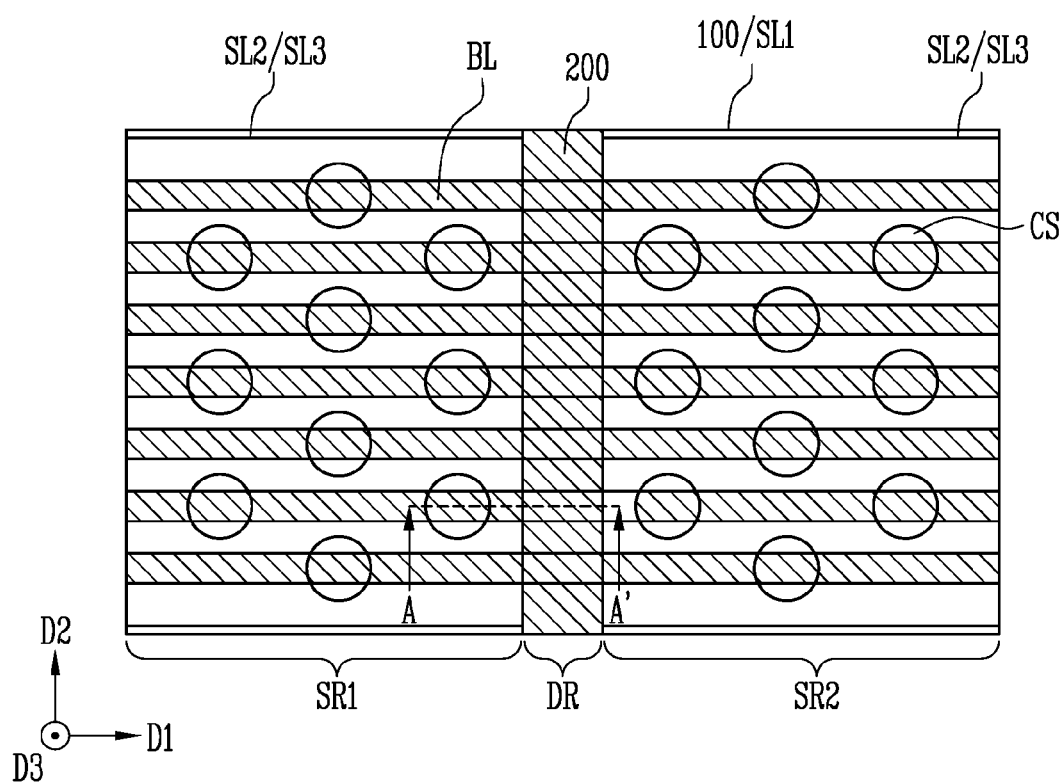

SEMICONDUCTOR MEMORY DEVICE AND METHOD OF MANUFACTURING THE SAME

CROSS-REFERENCE TO RELATED APPLICATION

The present application is a divisional application of U.S. patent application Ser. No. 17/231,629, filed on Apr. 15, 2021, and claims priority under 35 U.S.C. § 119(a) to Korean patent application number 10-2020-0167805 filed on Dec. 3, 2020, in the Korean Intellectual Property Office, the entire disclosure of which is incorporated by reference herein.

BACKGROUND

1. Technical Field

The present disclosure relates to a semiconductor memory device and a method of manufacturing the same, and more particularly, to a three-dimensional semiconductor memory device and a method of manufacturing the same.

2. Related Art

A semiconductor memory device is a memory device that is implemented using a semiconductor such as silicon (Si), germanium (Ge), gallium arsenide (GaAs), or indium phosphide (InP). Semiconductor memory devices are generally classified as volatile memory devices or nonvolatile memory devices.

A volatile memory device is a memory device in which stored data is lost when supplied power supply is interrupted. Volatile memory devices include static RAM (SRAM), dynamic RAM (DRAM), synchronous DRAM (SDRAM), and the like. A nonvolatile memory device is a memory device that maintains stored data even when supplied power is interrupted. Nonvolatile memory devices include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), and the like. Flash memory is generally classified as NOR type or NAND type.

As the use of portable electronic devices increases, the use of nonvolatile semiconductor memory devices also increases, and high integration and large capacity are required for portability and sufficient storage. For such high integration and large capacity needs, three-dimensional semiconductor memory devices have been proposed.

SUMMARY

An embodiment of the present disclosure provides a semiconductor memory device capable of improving operational reliability by improving an electrical characteristic, and a method of manufacturing the same.

According to an embodiment of the present disclosure, a semiconductor memory device includes a first source layer, a second source layer on the first source layer, a stack on the second source layer, a channel structure passing through the stack and the second source layer, and a common source line passing through the stack and the second source layer. The second source layer includes an air gap and a conductive layer surrounding the air gap.

According to an embodiment of the present disclosure, a method of manufacturing a semiconductor memory device includes forming a source structure including a source sacrificial structure, forming a stack on the source structure, forming a trench passing through the stack, forming a cavity by removing the source sacrificial structure through the trench, forming a first material layer including an air gap in the cavity, exposing a side portion of the air gap by etching a portion of the first material layer, and forming a second material layer that is in contact with the exposed side portion of the air gap.

According to an embodiment of the present disclosure, a method of manufacturing a semiconductor memory device includes forming a source structure including a source sacrificial structure, forming a stack on the source structure, forming a channel structure passing through the stack and the source structure, forming a trench passing through the stack, forming a cavity through which a lower side surface of the channel structure is exposed by removing the source sacrificial structure through the trench, and forming a conductive layer including an air gap in the cavity. The conductive layer includes a first material layer that is in contact with a lower sidewall of the channel structure and in contact with an upper surface, a lower surface, and a first side surface of the air gap. The conductive layer also includes a second material layer that is in contact with a second side surface of the air gap.

A semiconductor memory device according to an embodiment of the present technology may improve a process defect due to a seam or a void inside a conductive layer that is in contact with a channel structure, thereby improving an electrical characteristic and reliability of the semiconductor memory device.

BRIEF DESCRIPTION OF THE DRAWINGS

FIG. 1A is a plan view of a semiconductor memory device according to an embodiment of the present disclosure.

DETAILED DESCRIPTION

Figure 1B:
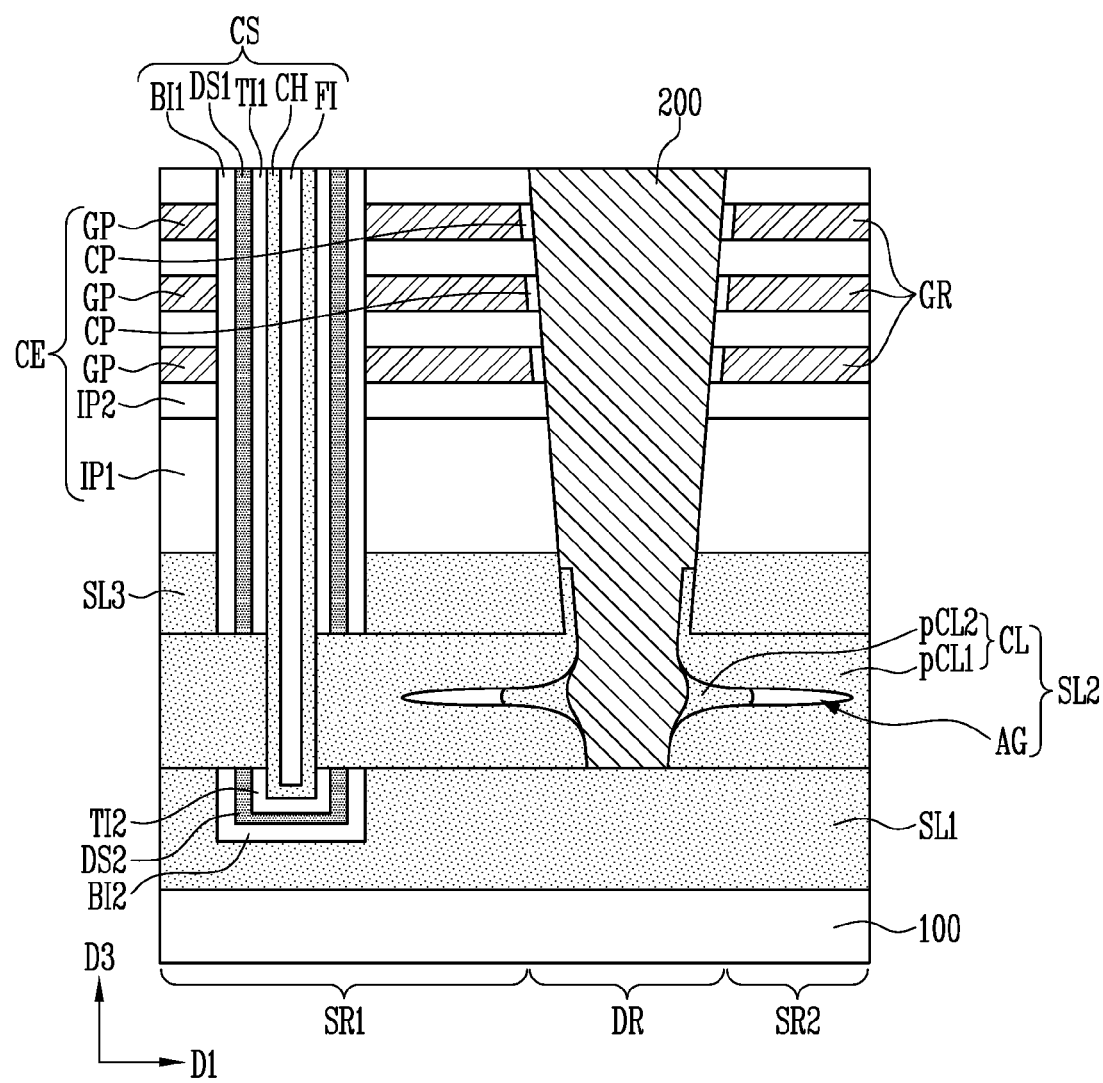
FIG. 1B is a cross-sectional view taken along a line A-A' of FIG. 1A.

Hereinafter, an embodiment of the present disclosure is described. In the drawings, thicknesses and distances are illustrated for convenience of description, and may be exaggerated relative to actual physical thicknesses and distances. In describing the present disclosure, known configurations irrespective of the gist of the present disclosure may be omitted. It should be noted that in adding reference numerals to the components of each drawing, the same components have the same number if possible, even though the same components are shown in different drawings.

Throughout the specification, in a case in which a portion is "connected" to another portion, the case includes not only a case in which the portion is "directly connected" to the other portion but also a case in which the portion is "indirectly connected" to the other portion with another element interposed therebetween. Throughout the specification, in a case in which a portion includes a component, the case means that the portion may further include other components without excluding other components unless specifically stated otherwise.

FIG. 1A is a plan view of a semiconductor memory device according to an embodiment of the present disclosure. FIG. 1B is a cross-sectional view taken along a line A-A' of FIG. 1A.

Referring to FIGS. 1A and 1B, the semiconductor memory device may include a substrate 100. The substrate 100 may have a shape of a plate extending along a plane defined by a first direction D1 and a second direction D2. The substrate 100 may be a single crystal semiconductor substrate. For example, the substrate 100 may be a bulk silicon substrate, a silicon-on-insulator substrate, a germanium substrate, a germanium-on-insulator substrate, a silicon-germanium substrate, or an epitaxial thin film formed through a selective epitaxial growth method.

The substrate 100 may include a first stack region SR1, a second stack region SR2, and a separation region DR. The first stack region SR1 and the second stack region SR2 may be spaced apart from each other in the first direction D1 with the separation region DR interposed therebetween. The separation region DR may be one of a plurality of slit regions separating the stacks.

A source structure SL may be provided on the substrate 100. The source structure SL may include a conductive material.

For example, as shown, the source structure SL may include first to third source layers SL1, SL2, and SL3. As another example, differently from that shown, the source structure SL may be formed of a single layer. Hereinafter, an example in which the source structure SL includes the first to third source layers SL1, SL2, and SL3 is described, but a structure of the source structure SL is not limited thereto.

Differently from that shown, in an embodiment different from the present embodiment, a peripheral circuit structure and a connection structure may be provided between the substrate 100 and the source structure SL. The peripheral circuit structure may include NMOS transistors, PMOS transistors, a resistor, and a capacitor. The NMOS transistors, the PMOS transistors, the resistor, and the capacitor may be used as elements configuring a row decoder, a column decoder, a page buffer circuit, and an input/output circuit. The connection structure may include a contact plug and a wire.

For convenience of description, in the present embodiment, the source structure SL is directly provided on the substrate 100. The first source layer SL1 may be provided on the substrate 100. The first source layer SL1 may have a shape of a plate extending along a plane defined by the first direction D1 and the second direction D2. For example, the first source layer SL1 may include polysilicon.

The second source layer SL2 may be provided on the first source layer SL1. The third source layer SL3 may be provided on the second source layer SL2. A stack CE may be provided on the third source layer SL3. The second and third source layers SL2 and SL3 and the stack CE may be provided on the first and second stack regions SR1 and SR2 of the substrate 100. A common source line 200 may be provided on the separation region DR of the substrate 100. The common source line 200 may pass through the stack CE, the second source layer SL2, and the third source layer SL3.

The common source line 200 may extend in the second direction D2. The common source line 200 may include a conductive material. For example, the common source line 200 may include polysilicon or tungsten.

The second source layer SL2 may have a shape of a plate extending along a plane defined by the first direction D1 and the second direction D2. The second source layer SL2 may include a conductive layer CL and an air gap AG. The conductive layer CL may be connected to the first source layer SL1 and the third source layer SL3. The air gap AG may be provided inside the conductive layer CL. In other words, the air gap AG may be surrounded by the conductive layer CL. The conductive layer CL may include a first material layer pCL1 and a second material layer pCL2. The first material layer pCL1 may be in contact with an upper surface, a lower surface, and a first side surface of the air gap AG. The second material layer pCL2 may be in contact with a second side surface of the air gap AG. The first side surface of the air gap AG is a side surface adjacent to a channel structure CS to be described later, and the second side surface of the air gap AG is a side surface adjacent to the common source line 200. The air gap AG may be spaced apart from the channel structure CS by the first material layer pCL1, and may be spaced apart from the common source line 200 by the second material layer pCL2. The conductive layer CL may be in contact with the channel structure CS to be described later. For example, the first material layer pCL1 of the conductive layer CL may be in contact with the channel structure CS. The conductive layer CL may be in contact with the common source line 200. For example, the first material layer pCL1 and the second material layer pCL2 may be in contact with the common source line 200.

For example, the first material layer pCL1 may include polysilicon doped with a dopant. For example, the second material layer pCL2 may be formed of polysilicon, polysilicon doped with a dopant, an oxide layer, or a metal layer.

The third source layer SL3 may have a shape of a plate extending along a plane defined by the first direction D1 and the second direction D2. For example, the third source layer SL3 may include polysilicon.

The stack CE may include a first insulating pattern IP1, second insulating patterns IP2, gate patterns GP, and capping patterns CP.

The first insulating pattern IP1 may be provided on the third source layer SL3. For example, the first insulating pattern IP1 may include silicon oxide.

The second insulating patterns IP2 and the gate patterns GP may be provided on the first insulating pattern IP1. The second insulating patterns IP2 and the gate patterns GP may be alternately stacked along the third direction D3. The third direction D3 may be a direction crossing an upper surface of the substrate 100. For example, the third direction D3 may be a direction perpendicular to the upper surface of the substrate 100.

The gate patterns GP may include a gate conductive layer. For example, the gate conductive layer may include at least one of a doped silicon layer, a metal silicide layer, tungsten, nickel, and cobalt, and may be used as a word line connected to a memory cell or a select line connected to a select transistor. The gate patterns GP may further include a gate barrier layer surrounding the gate conductive layer. For example, the gate barrier layer may include at least one of titanium nitride and tantalum nitride. For example, the second insulating patterns IP2 may include silicon oxide.

Each of the capping patterns CP may be disposed between the second insulating patterns IP2. Each of the capping patterns CP may be provided between the gate pattern GP and the common source line 200. The gate pattern GP and the common source line 200 may be separated from each other by the capping pattern CP. The gate pattern GP and the common source line 200 may be electrically separated from each other by the capping pattern CP. For example, the capping patterns CP may include silicon oxide.

Differently from that shown, an insulating spacer (not shown) may electrically separate the gate pattern GP and the common source line 200 from each other instead of the capping patterns CP. The insulating spacer may extend along a sidewall of the common source line 200. For example, the insulating spacer may include silicon oxide.

The semiconductor memory device according to the present embodiment may further include the channel structures CS passing through the stack CE. The channel structure CS may pass through the second source layer SL2 and the third source layer SL3. The channel structures CS may extend in the third direction D3. The channel structure CS may be in contact with the first source layer SL1. A lowermost portion of the channel structure CS may be provided in the first source layer SL1. The channel structure CS may be in contact with the second source layer SL2.

Each of the channel structures CS may include a filling layer FI, a channel layer CH surrounding the filling layer FI, a first tunnel layer TI1 surrounding an upper portion of the channel layer CH, a second tunnel layer TI2 surrounding a lower portion of the channel layer CH, a first storage layer DS1 surrounding the first tunnel layer TI1, a second storage layer DS2 surrounding the second tunnel layer TI2, a first blocking layer BI1 surrounding the first storage layer DS1, and a second blocking layer BI2 surrounding the second storage layer DS2.

The filling layer FI and the channel layer CH may pass through the second source layer SL2. A sidewall of the channel layer CH may be in contact with the conductive layer CL of the second source layer SL2. That is, the sidewall of the channel layer CH may be in contact with the first material layer pCL1. The first and second tunnel layers TI1 and TI2 may be spaced apart from each other in the third direction D3 by the second source layer SL2. The first and second storage layers DS1 and DS2 may be spaced apart from each other in the third direction D3 by the second source layer SL2. The second tunnel layer TI2, the second storage layer DS2, and the second blocking layer BI2 may be provided in the first source layer SL1.

For example, the filling layer FI may include silicon oxide. For example, the channel layer CH may include doped polysilicon or undoped polysilicon. The first and second tunnel layers TI1 and TI2 may include an oxide capable of charge tunneling. For example, the first and second tunnel layers TI1 and TI2 may include silicon oxide. For example, the first and second tunnel layers TI1 and TI2 may have a first thickness capable of charge tunneling. The first and second storage layers DS1 and DS2 may include a material capable of trapping a charge. For example, the first and second storage layers DS1 and DS2 may include at least one of nitride, silicon, a phase change material, and a nanodot. The first and second blocking layers BI1 and BI2 may include an oxide capable of blocking movement of a charge. For example, the first and second blocking layers BI1 and BI2 may include silicon oxide. For example, the first and second blocking layers BI1 and BI2 may have a second thickness capable of blocking movement of a charge. The second thickness may be thicker than the first thickness.

The semiconductor memory device according to the present embodiment may further include bit lines BL connected to the channel structures CS. The bit lines BL may extend in the first direction D1. The bit lines BL may be arranged to be spaced apart from each other in the second direction D2. Each of the bit lines BL may be electrically connected to the channel structures CS through bit line contacts (not shown). The bit lines BL may include a conductive material. For example, the bit lines BL may include tungsten, aluminum, or copper.

In the semiconductor memory device according to the present embodiment, the second source layer SL2 may include the conductive layer CL and the air gap AG, and the air gap AG may be spaced apart from the common source line 200 by the second material layer pCL2. In addition, during a process of forming the second material layer pCL2, a position and a horizontal length of the air gap AG formed in the second source layer SL2 may be adjusted by performing an etching process of the first material layer pCL1 so that the second side surface of the air gap AG is exposed. In addition, since the air gap AG is surrounded by the first material layer pCL1 and the second material layer pCL2, the second source layer SL2 may be prevented from being damaged by preventing an inflow of a chemical during a subsequently performed process.

FIGS. 2A to 2J are cross-sectional views illustrating a method of manufacturing a semiconductor memory device according to an embodiment of the present disclosure.

For the sake of brevity, the same reference numerals are used for components described with reference to FIGS. 1A and 1B, and repetitive descriptions are omitted.

The manufacturing method described below is only one embodiment of a method of manufacturing the semiconductor memory device according to FIGS. 1A to 1B, and the method of manufacturing the semiconductor memory device according to FIGS. 1A to 1B is not limited to the manufacturing method described below.

Figure 2A:
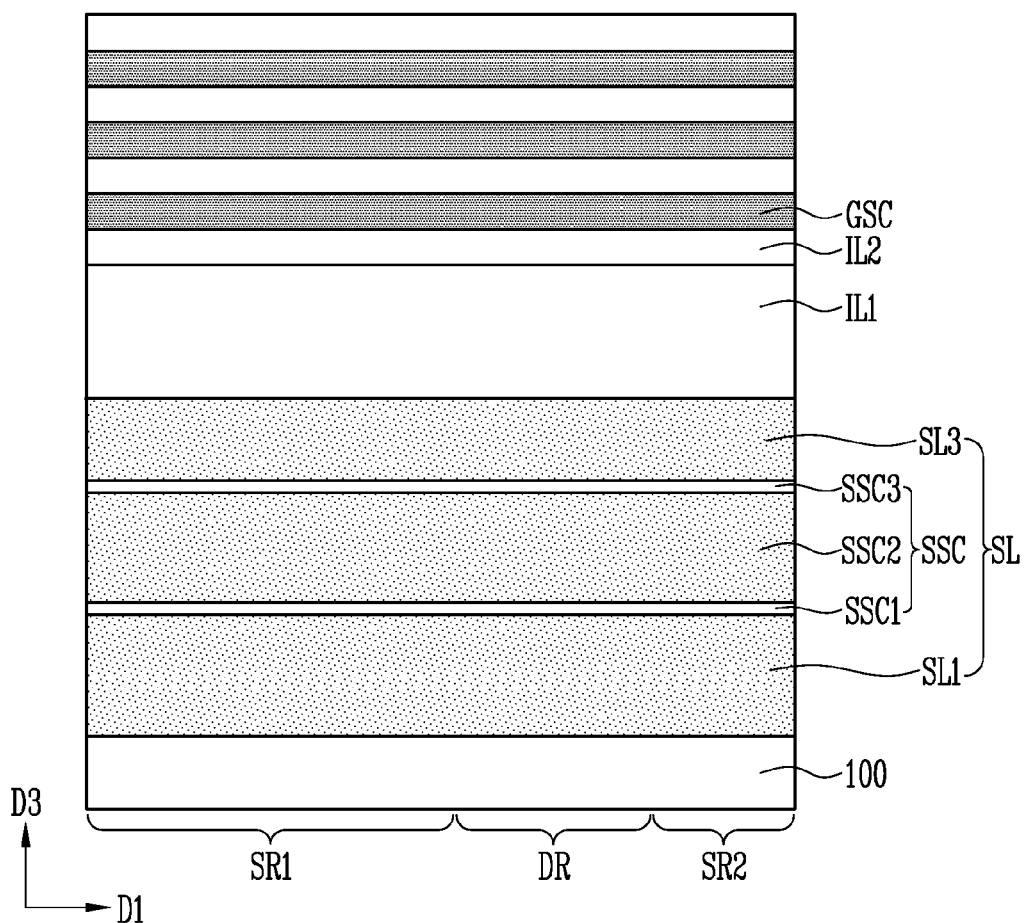
FIGS. 2A to 2J are cross-sectional views illustrating a manufacturing method of a semiconductor memory device in accordance with an embodiment of the present disclosure.

Referring to FIG. 2A, the source structure SL may be formed on the substrate 100. The source structure SL may include the first source layer SL1, a source sacrificial structure SSC, and the third source layer SL3.

For example, as shown, the source sacrificial structure SSC may include first to third source sacrificial layers SSC1, SSC2, and SSC3. As another example, differently from that shown, the source sacrificial structure SSC may be formed of a single layer. Hereinafter, an example in which the source sacrificial structure SSC includes the first to third source sacrificial layers SSC1, SSC2, and SSC3 is described, but a structure of the source sacrificial structure SSC is not limited thereto.

The source structure SL may be formed by sequentially forming the first source layer SL1, the first to third source sacrificial layers SSC1, SSC2, and SSC3, and the third source layer SL3 on the substrate 100.

Subsequently, a first insulating layer IL1 may be formed on the source structure SL, and second insulating layers IL2 and the gate sacrificial layers GSC may be alternately stacked on the first insulating layer IL1.

For example, the first source sacrificial layer SSC1 may include an oxide or a high dielectric constant (high-k) material. For example, the high dielectric constant material may include $Al_2O_3$. For example, the second source sacrificial layer SSC2 may include polysilicon. For example, the third source sacrificial layer SSC3 may include an oxide or a high dielectric constant (high-k) material.

For example, the first insulating layer IL1 and the second insulating layer IL2 may include silicon oxide. The gate sacrificial layer GSC may include a material having a high etching selectivity with respect to the second insulating layer IL2. For example, the gate sacrificial layer GSC may include silicon nitride.

Figure 2B:
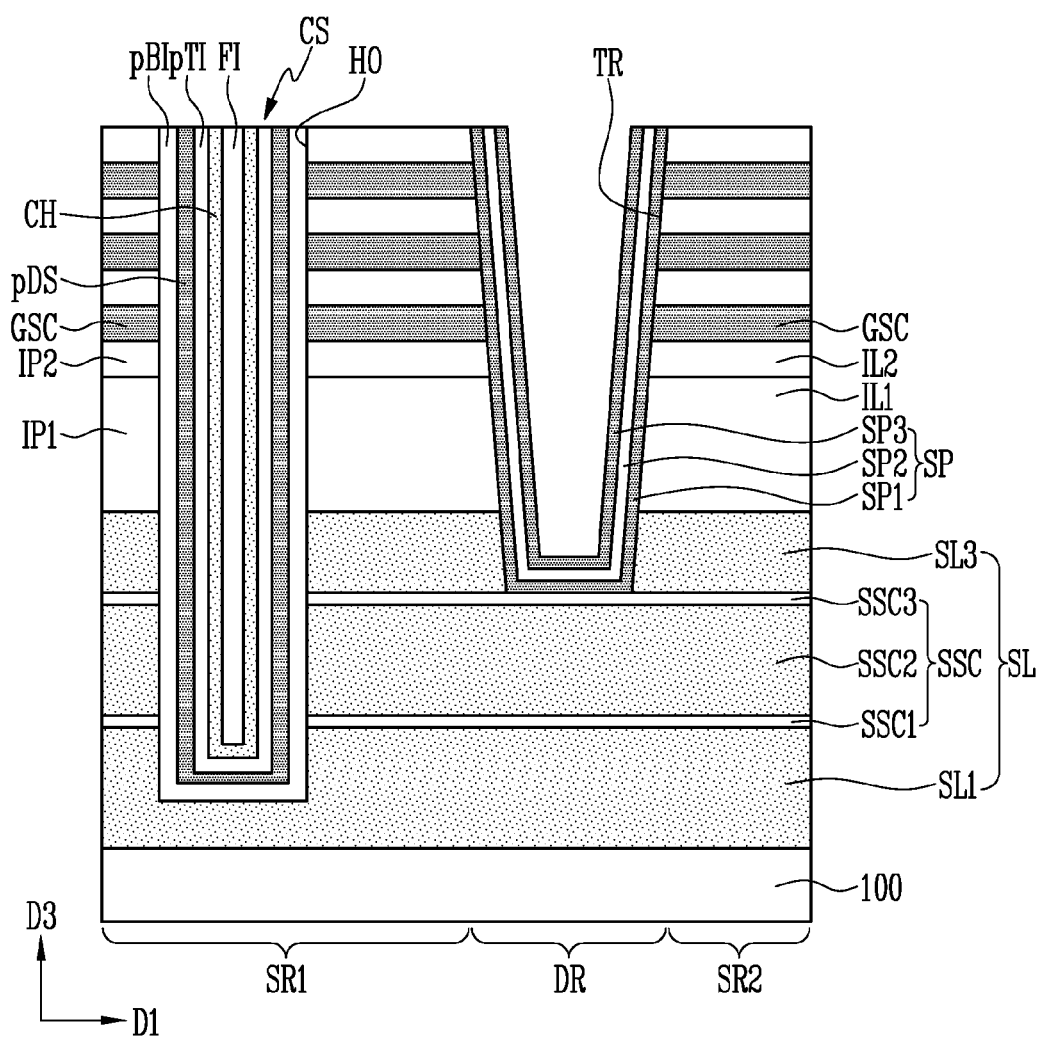

Referring to FIG. 2B, the channel structures CS passing through the first to third source sacrificial layers SSC1, SSC2, and SSC3, the third source layer SL3, the first insulating layer IL1, the second insulating layers IL2, and the gate sacrificial layers GSC may be formed. The channel structure CS may include a preliminary blocking layer pBI, a preliminary storage layer pDS, a preliminary tunnel layer pTI, the channel layer CH, and the filling layer FI.

Forming the channel structures CS may include forming holes HO passing through first to third source sacrificial layers SSC1, SSC2, and SSC3, the third source layer SL3, the first insulating layer IL1, the second insulating layers IL2, and the gate sacrificial layers GSC, and sequentially filling each of the holes HO with the preliminary blocking layer pBI, the preliminary storage layer pDS, the preliminary tunnel layer pTI, the channel layer CH, and the filling layer FI.

For example, the preliminary blocking layer pBI may include silicon oxide. For example, the preliminary storage layer pDS may include at least one of nitride, silicon, a phase change material, and a nanodot. For example, the preliminary tunnel layer pTI may include silicon oxide.

A trench TR passing through the first insulating layer IL1, the second insulating layers IL2, and the gate sacrificial layers GSC may be formed. The trench TR may pass through at least a portion of the source structure SL. For example, the trench TR may pass through the third source layer SL3 of the source structure SL.

The trench TR may extend in the second direction D2. An upper surface of the third source sacrificial layer SSC3 may be exposed by the trench TR, and sidewalls of the third source layer SL3, the first and second insulating layers IL1 and IL2, and the gate sacrificial layers GSC may be exposed. The trench TR may vertically overlap the separation region DR of the substrate 100.

A spacer layer SP conformally covering the upper surface of the third source sacrificial layer SSC3 exposed by the trench TR and conformally covering the sidewalls of the third source layer SL3, the first and second insulating layers IL1 and IL2, and the gate sacrificial layers GSC may be formed.

For example, as shown, the spacer layer SP may include first to third spacer layers SP1, SP2, and SP3. As another example, differently from that shown, the spacer layer SP may be formed of a single layer. Hereinafter, an example in which the spacer layer SP includes the first to third spacer layers SP1, SP2, and SP3 is described, but a structure of the spacer layer SP is not limited thereto.

The first spacer layer SP1 may be formed on surfaces defining the trench TR. For example, the first spacer layer SP1 may include silicon nitride. The second spacer layer SP2 may be formed on the first spacer layer SP1, and the third spacer layer SP3 may be formed on the second spacer layer SP2. For example, the second spacer layer SP2 may include silicon oxide, and the third spacer layer SP3 may include silicon nitride.

According to the formation of the holes HO and the trench TR, the first insulating layer IL1 may be formed as the first insulating pattern IP1, and the second insulating layers IL2 may be the second insulating patterns IP2.

Figure 2C:
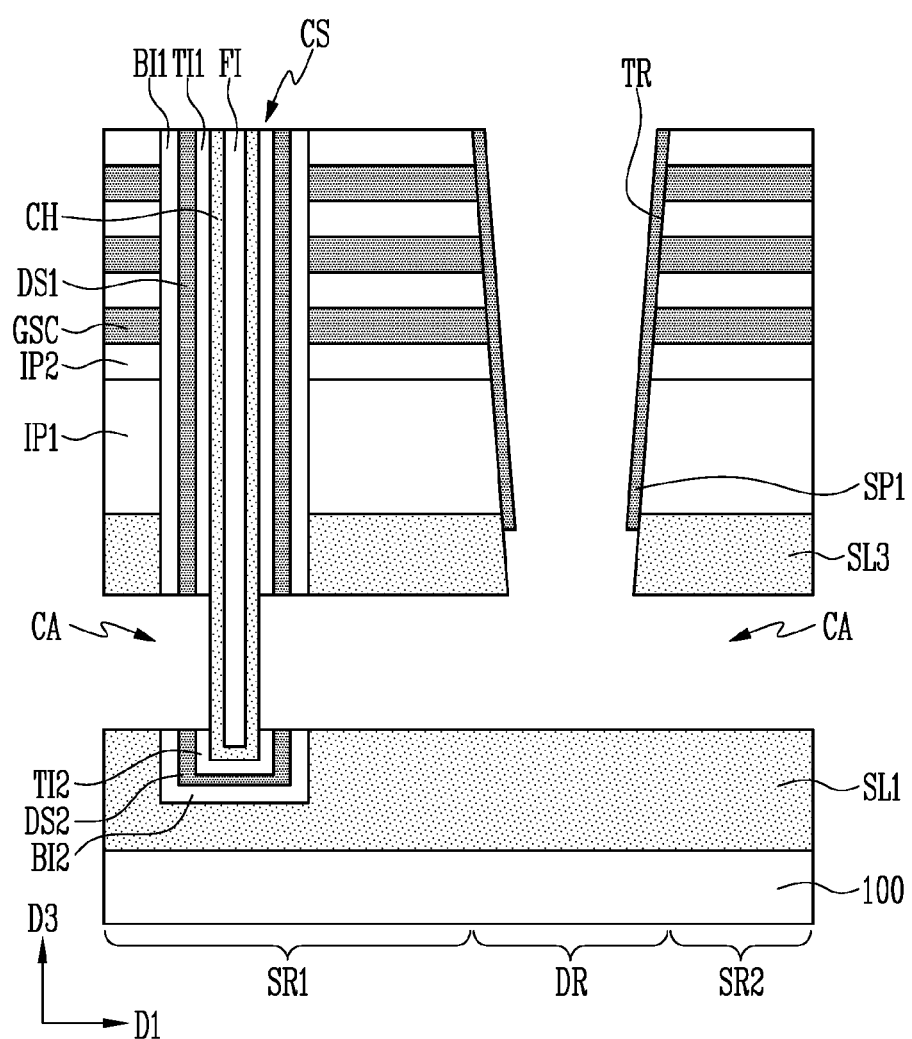

Referring to FIG. 2C, a portion of each of the first to third spacer layers SP1, SP2, and SP3 and the second source sacrificial layer SSC2 may be removed. Removing a portion of each of the first to third spacer layers SP1, SP2, and SP3 and the second source sacrificial layer SSC2 may include removing a portion of each of the first to third spacer layers SP1, SP2, and SP3, a portion of the third source sacrificial layer SSC3, and a portion of the second source sacrificial layer SSC2 through an etchback process, and removing all of the second source sacrificial layer SSC2 through a deep-out process.

After removing all of the second source sacrificial layer SSC2, the preliminary blocking layer pBI, the preliminary storage layer pDS, and the preliminary tunnel layer pTI of the channel structure CS may be patterned. By patterning, the preliminary blocking layer pBI may be formed as the first and second blocking layers BI1 and BI2, and the preliminary storage layer pDS may be formed as the first and second storage layers DS1 and DS2, and the preliminary tunnel layer pTI may be formed as the first and second tunnel layers TI1 and TI2. Simultaneously with patterning the preliminary blocking layer pBI, the preliminary storage layer pDS, and the preliminary tunnel layer pTI of the channel structure CS, the first source sacrificial layer SSC1 and the third source sacrificial layer SSC3 may be removed, and the second and third spacer layers SP2 and SP3 may be removed. As the first to third source sacrificial layers SSC1, SSC2, and SSC3 are removed, and the preliminary blocking layer pBI, the preliminary storage layer pDS, and the preliminary tunnel layer pTI are patterned, a cavity CA may be formed between the first source layer SL1 and the third source layer SL3. The cavity CA may include an empty space formed by removing the first to third source sacrificial layers SSC1, SSC2, and SSC3, and an empty space formed by etching the preliminary blocking layer pBI, the preliminary storage layer pDS, and the preliminary tunnel layer pTI.

Figure 2D:
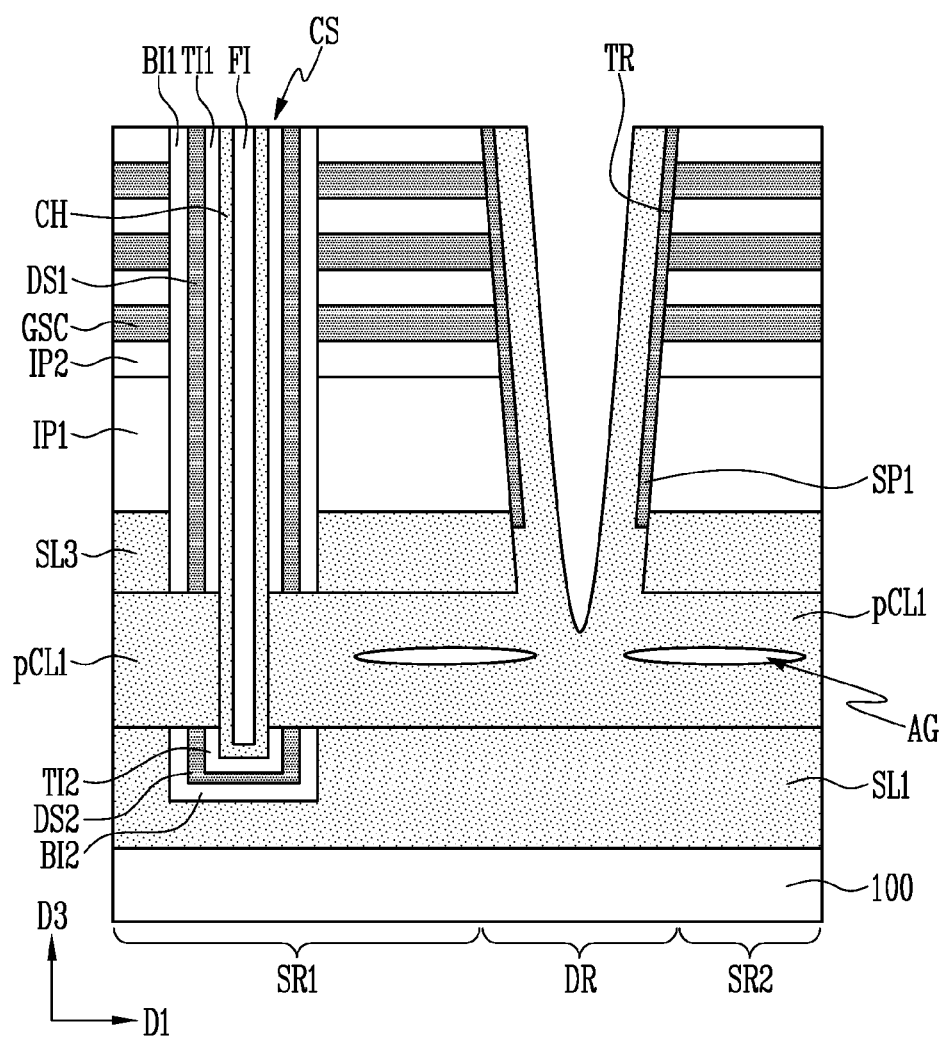

Referring to FIG. 2D, the first material layer pCL1 filling a portion or all of the cavity CA formed in FIG. 2C described above and a portion of the trench TR may be formed. The first material layer pCL1 may be filled in the cavity CA and may include the air gaps AG such as a seam or a void therein. The first material layer pCL1 may cover surfaces of the first source layer SL1, the third source layer SL3, and the channel structure CS defining the cavity CA. The first material layer pCL1 may cover a sidewall of the first spacer layer SP1. The first material layer pCL1 may be formed along surfaces exposed by the trench TR and the cavity CA.

The first material layer pCL1 may be formed of polysilicon doped with an impurity. For example, the first material layer pCL1 may be formed of polysilicon doped with at least one dopant among Boron, Phosphorus, Arsenic, Carbon, Nitrogen, and Hydrogen.

Figure 2E:
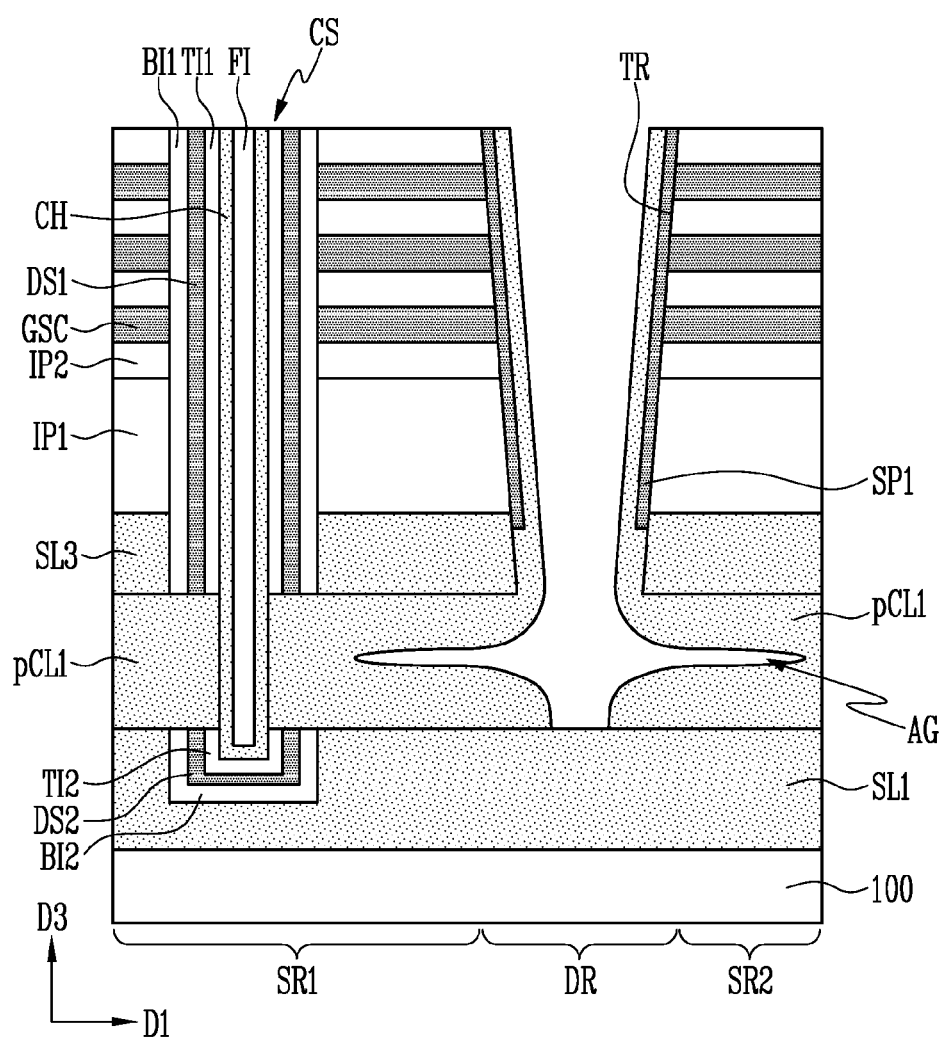

Referring to FIG. 2E, the air gap AG formed in the first material layer pCL1 is exposed by performing an etching process. The etching process may be performed using a dry etching process or a wet etching process. In the etching process, an etching process recipe may be configured so that an etching rate is high in an isotropic or horizontal direction using an etching gas and a chemical capable of etching the first material layer pCL1. For example, during the etching process, at least one of HBr, Cl2, F2, SC-1, NF4, and NH3 is used to expose one side surface of the air gap AG formed in the first material layer pCL1. At this time, an opening portion of the air gap AG may be formed so that a width of an entrance is wider than that of an interior portion.

Figure 2F:
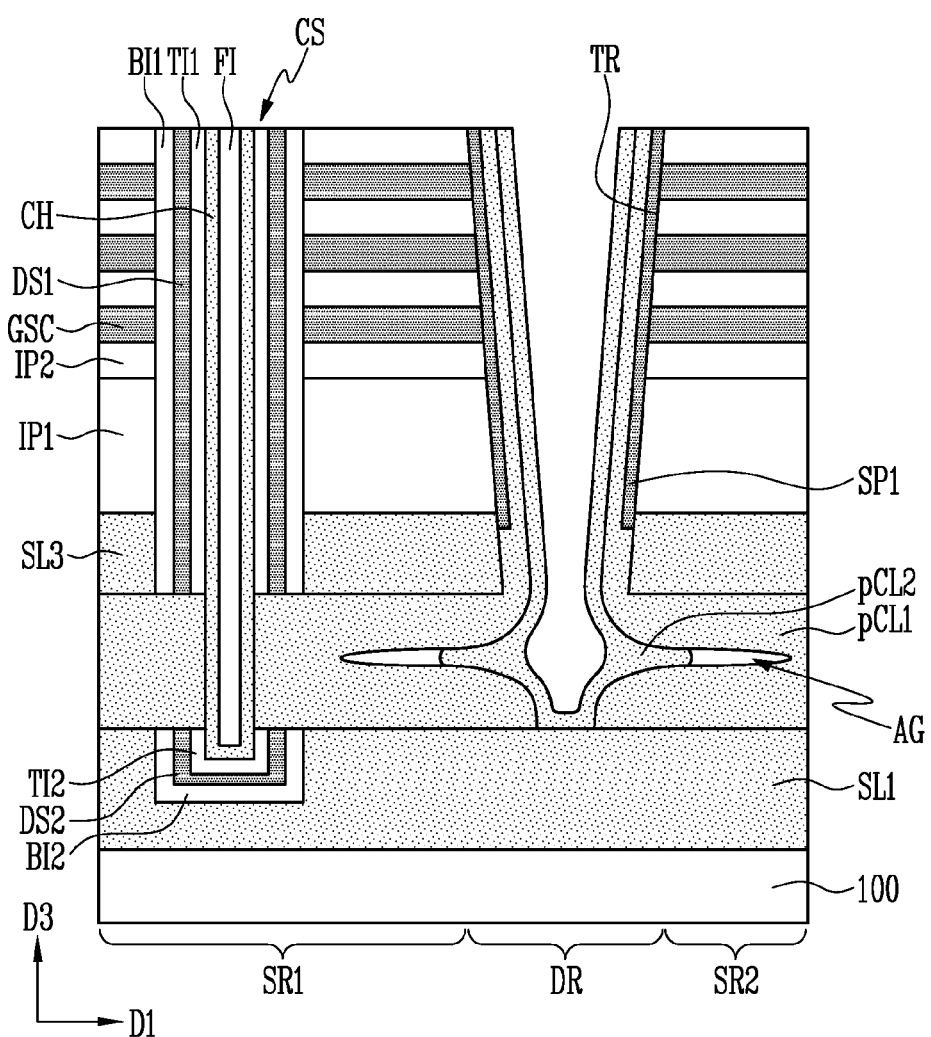

Referring to FIG. 2F, the second material layer pCL2 is formed along the exposed surface of the first material layer pCL1. At this time, the second material layer pCL2 is formed up to a partial region of the air gap AG, and one exposed side surface of the air gap AG is shielded by the second material layer pCL2. Accordingly, a length of the air gap AG may be reduced in a horizontal direction compared to the air gap AG of FIG. 2D formed in the first material layer pCL1 during the formation process of the first material layer pCL1, and continuity with an adjacent air gap AG is blocked.

The second material layer pCL2 may be formed of polysilicon, oxide, metal or polysilicon doped with at least one dopant among Boron, Phosphorus, Arsenic, Carbon, Nitrogen, and Hydrogen.

Before forming the second material layer pCL2, an oxide or carbon-based thin film (not shown) may be additionally formed along the surface of the first material layer pCL1.

Figure 2G:
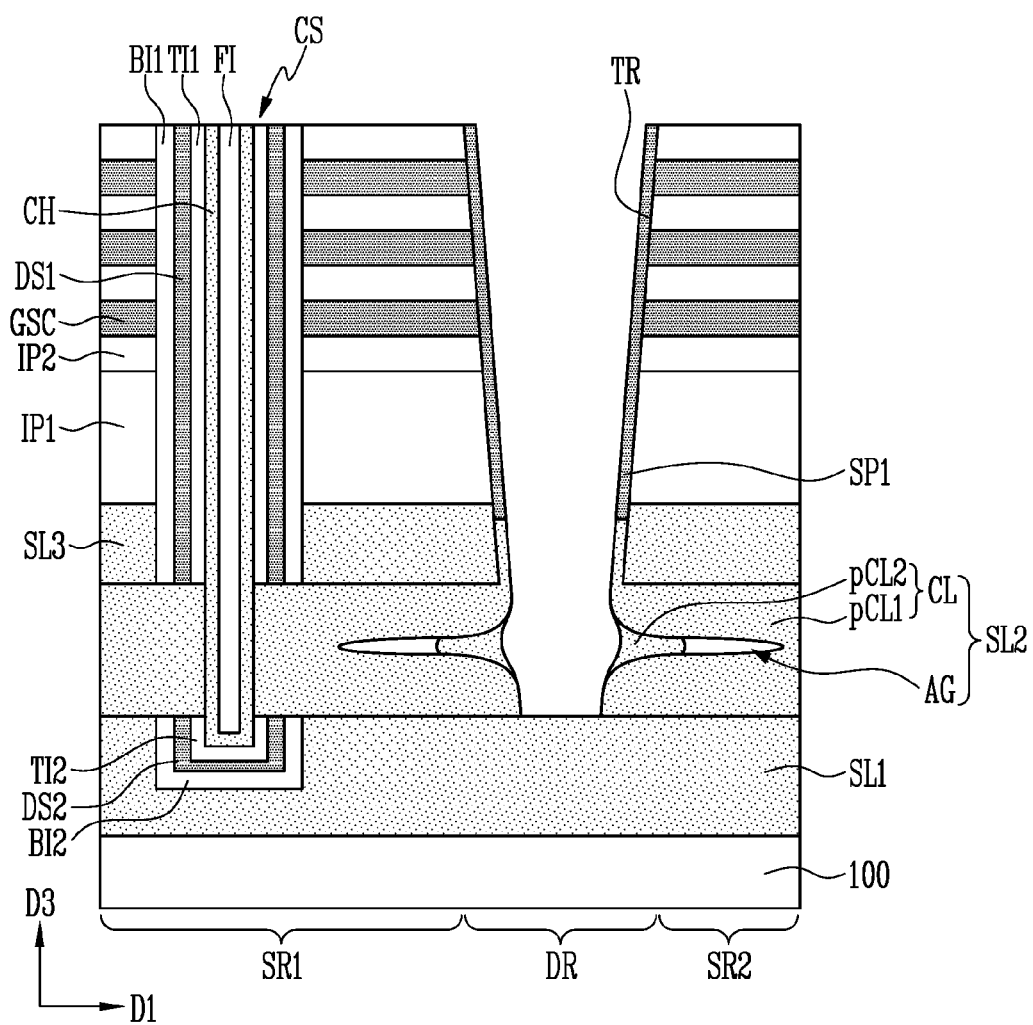

Referring to FIG. 2G, an etching process is performed to remove the second material layer pCL2 and the first material layer pCL1 formed in the trench TR so that the sidewall of the first spacer layer SP1 is exposed. By the above-described etching process, the second material layer pCL2 may remain only on one side surface of the air gap AG, and the side surface of the first material layer pCL1 formed in the cavity may be exposed. FIG. 2G shows that the first material layer pCL1 remains on a sidewall of the third source layer SL3. However, the first material layer pCL1 formed on the sidewall of the third source layer SL3 may be removed during the above-described etching process to expose the sidewall of the third source layer SL3. The above-described etching process may be performed using a dry etching process or a wet etching process.

The first material layer pCL1, the second material layer pCL2, and the air gap AG formed in the cavity may be defined as the second source layer SL2.

Figure 2H:
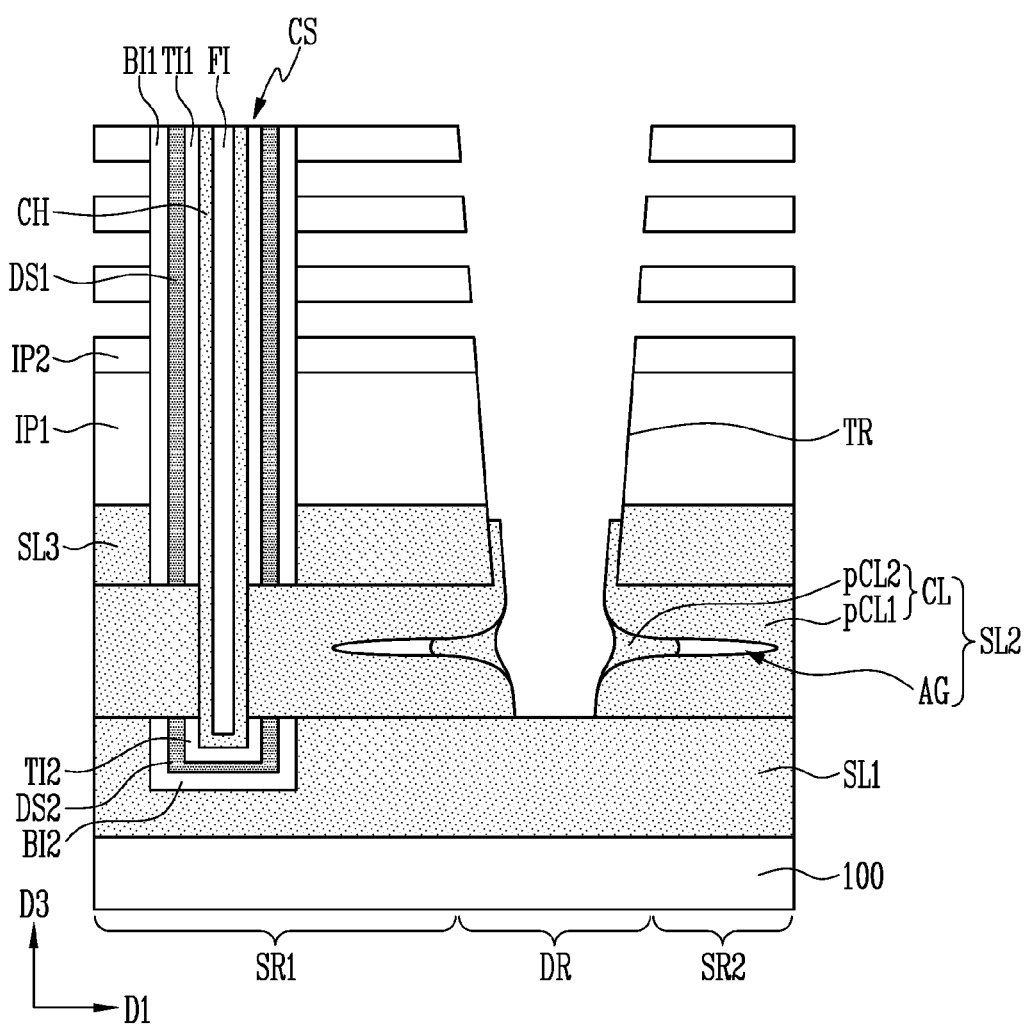

Referring to FIG. 2H, the first spacer layer SP1 may be removed, and thus the exposed gate sacrificial layers GSC may be removed. During the process of removing the sacrificial gate layers GSC, an opening of the air gap AG may be shielded by the second material layer pCL2, and thus an etching chemical may be prevented from flowing into the air gap AG.

Additionally, a barrier layer may be formed along exposed surfaces of the first material layer pCL1, the second material layer pCL2, and the first source layer SL1 before removing the first spacer layer SP1. The barrier layer may be formed of silicon oxide. The barrier layer may be formed by oxidizing the exposed surfaces of the first material layer pCL1, the second material layer pCL2, and the first source layer SL1, and the barrier layer may be formed to have a uniform thickness or a uniform film quality on the surfaces of the first material layer pCL1, the second material layer pCL2, and the first source layer SL1. The barrier layer may prevent the first source layer SL1, the first material layer pCL1, and the second material layer pCL2 from being damaged due to the etchant (for example, phosphoric acid) used in a subsequently performed removal process of the gate sacrificial layers GSC.

Figure 2I:
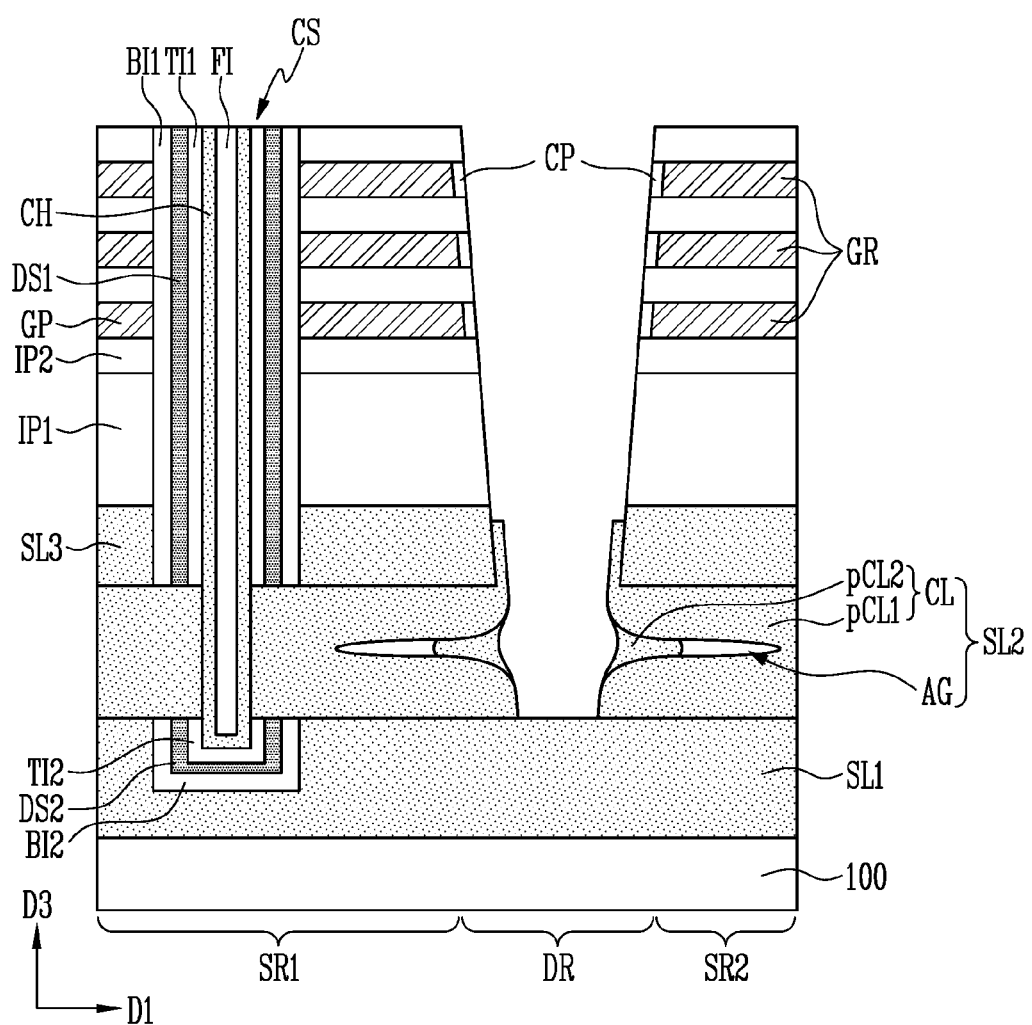

Referring to FIG. 2I, the gate patterns GP may be formed between the second insulating patterns IP2. Subsequently, the capping patterns CP covering the gate patterns GP may be formed. The capping patterns CP may serve to electrically separate the common source line 200 and the gate patterns GP formed later. The capping patterns CP may be formed by partially oxidizing the gate patterns GP. Alternatively, the capping patterns CP may be formed by removing some of the gate patterns GP and forming an insulating material in the empty space from which some of the gate patterns GP have been removed.

Figure 2J:
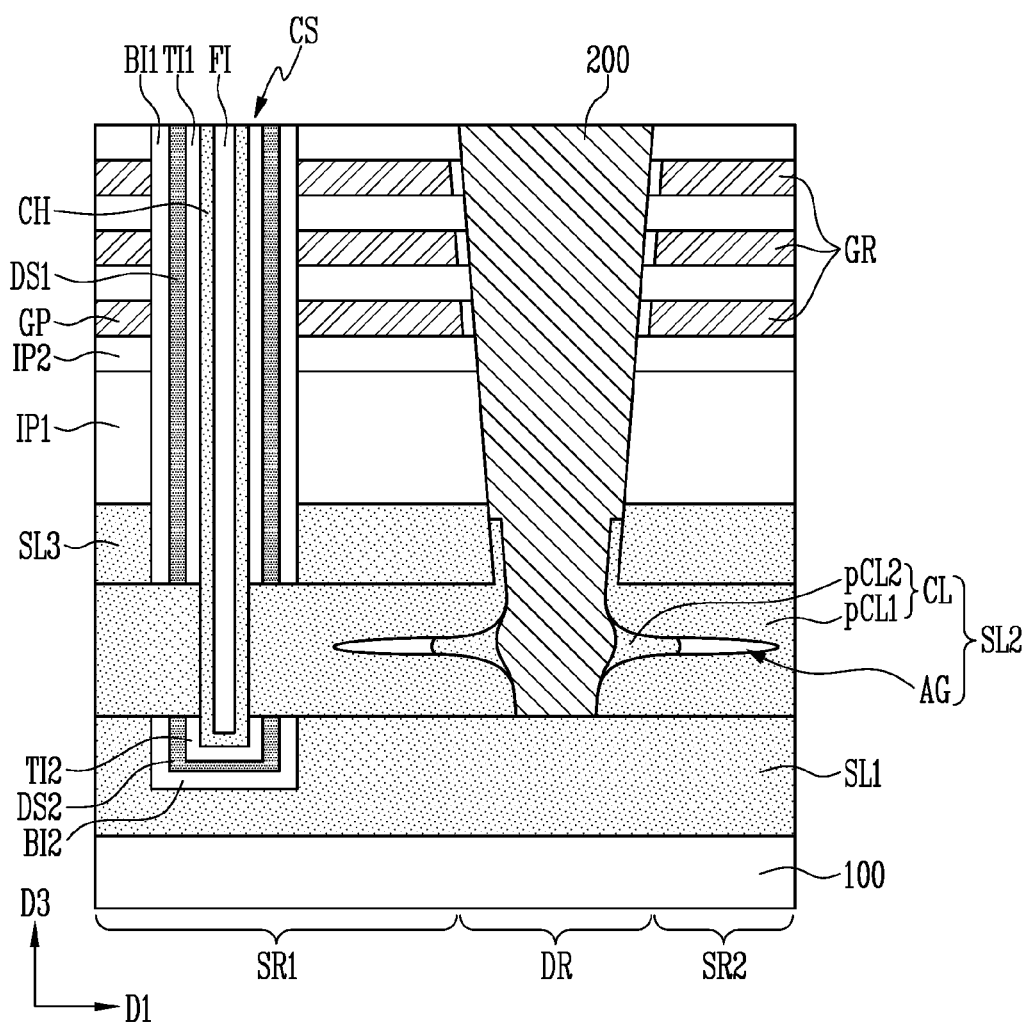

Referring to FIG. 2J, the common source line 200 may be formed in the trench TR and the cavity CA. The common source line 200 may completely fill the trench TR and the cavity CA. Subsequently, the bit line contacts connected to the channel structures CS may be formed, and bit lines connected to the bit line contacts may be formed.

Figure 3:
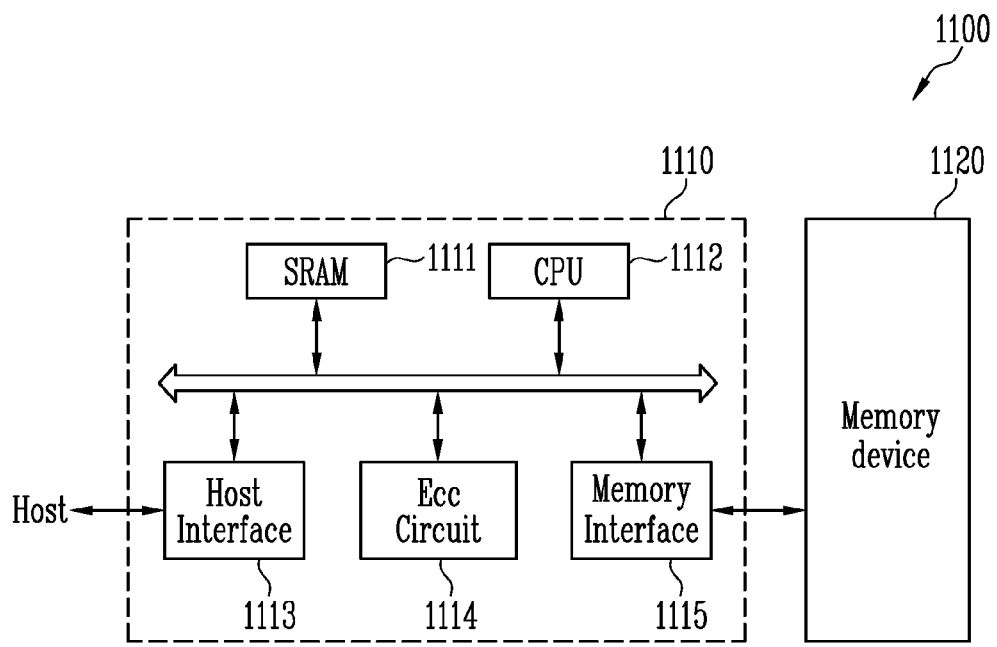
FIG. 3 is a block diagram illustrating a configuration of a memory system according to an embodiment of the present disclosure.

FIG. 3 is a block diagram illustrating a configuration of a memory system 1100 according to an embodiment of the present disclosure.

Referring to FIG. 3, the memory system 1100 includes a memory device 1120 and a memory controller 1110.

The memory device 1120 may include the structure described with reference to FIGS. 1A and 1B. The memory device 1120 may be a multi-chip package configured of a plurality of flash memory chips.

The memory controller 1110 is configured to control the memory device 1120 and may include static random access memory (SRAM) 1111, a central processing unit (CPU) 1112, a host interface 1113, an error correction code circuit (ECC) 1114, and a memory interface 1115. The SRAM 1111 is used as an operation memory of the CPU 1112, the CPU 1112 performs all control operations for data exchange of the memory controller 1110, and the host interface 1113 includes a data exchange protocol of a host connected to the memory system 1100. In addition, the ECC circuit 1114 detects and corrects errors included in data read from the memory device 1120, and the memory interface 1115 performs interfacing with the memory device 1120. In addition, the memory controller 1110 may further include read only memory (ROM) that stores code data for interfacing with the host.

The memory system 1100 described above may be a memory card or a solid state disk (SSD) with which the memory device 1120 and the memory controller 1110 are combined. For example, when the memory system 1100 is an SSD, the memory controller 1110 may communicate with the outside (for example, a host) through at least one of various interface protocols such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), and integrated drive electronics (IDE).

Figure 4:
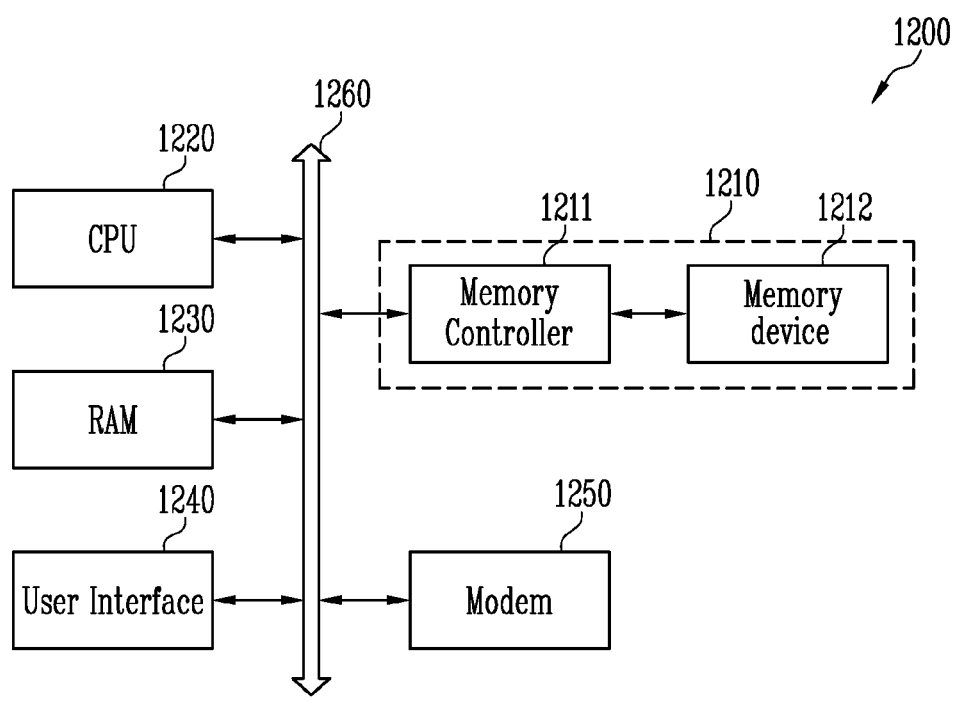
FIG. 4 is a block diagram illustrating a configuration of a computing system according to an embodiment of the present disclosure.

FIG. 4 is a block diagram illustrating a configuration of a computing system 1200 according to an embodiment of the present disclosure.

Referring to FIG. 4, the computing system 1200 may include a CPU 1220, random access memory (RAM) 1230, a user interface 1240, a modem 1250, and a memory system 1210, which are electrically connected to a system bus 1260. In addition, when the computing system 1200 is a mobile device, a battery for supplying an operation voltage to the computing system 1200 may be further included, and an application chipset, a camera image processor (CIS), a mobile DRAM, and the like may be further included.

The memory system 1210 may be configured of the memory device 1212 and the memory controller 1211 as described with reference to FIG. 3.

Although the technical spirit of the present disclosure has been described using embodiments, it should be noted that the above-described embodiments are for the purpose of description and not for limitation. In addition, those skilled in the art will understand that various additional embodiments are possible within the scope of the technical spirit of the present disclosure.

What is claimed is:

1. A method of manufacturing a semiconductor memory device, the method comprising:
   forming a source structure including a source sacrificial structure;

forming a stack on the source structure;

forming a trench passing through the stack;

forming a cavity by removing the source sacrificial structure through the trench;

forming a first material layer including an air gap in the cavity;

exposing a side portion of the air gap by etching a portion of the first material layer; and forming a second material layer that is in contact with the exposed side portion of the air gap.

2. The method of claim 1, further comprising forming a common source line in an empty space of the trench and the cavity.

3. The method of claim 1, wherein forming the second material layer comprises:

forming the second material layer along a surface of the first material layer so that the air gap is shielded by the second material layer; and etching a portion of the second material layer so that the second material layer remains only at the exposed side portion of the air gap.

4. The method of claim 1, wherein the first material layer is etched so that an entrance to an opening of the air gap is wider than an interior portion of the air gap.

5. The method of claim 1, wherein etching the portion of the first material layer comprises etching the portion of the first material layer using at least one of HBr, Cl2, F2, SC-1, NF4, and NH3.

6. A method of manufacturing a semiconductor memory device, the method comprising:

forming a source structure including a source sacrificial structure;

forming a stack on the source structure;

forming a channel structure passing through the stack and the source structure;

forming a trench passing through the stack;

forming a cavity through which a lower side surface of the channel structure is exposed, by removing the source sacrificial structure through the trench; and forming a conductive layer including an air gap in the cavity, wherein the conductive layer includes:

a first material layer that is in direct contact with a lower sidewall of the channel structure and in contact with an upper surface, a lower surface, and a first side surface of the air gap; and a second material layer that is in direct contact with a second side surface of the air gap.

7. The method of claim 6, wherein forming the conductive layer comprises:

forming the first material layer including the air gap in the cavity;

etching the first material layer so that the second side surface of the air gap is exposed;

forming the second material layer along a surface of the first material layer so that the second side surface of the air gap is shielded; and etching a portion of the second material layer so that the second material layer remains only on the second side surface of the air gap.

8. The method of claim 6, wherein the first material layer comprises polysilicon doped with an impurity.

9. The method of claim 6, wherein the second material layer comprises polysilicon, polysilicon doped with an impurity, an oxide layer, or a metal layer.

* * * * *